(12) United States Patent
Sun et al.

(10) Patent No.: US 10,453,546 B2
(45) Date of Patent: Oct. 22, 2019

(54) SHIFT REGISTER, GATE DRIVING CIRCUIT CONTAINING THE SAME, AND METHOD FOR DRIVING THE SAME

(71) Applicant: BOE TECHNOLOGY GROUP CO., LTD., Beijing (CN)

(72) Inventors: Tuo Sun, Beijing (CN); Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 181 days.

(21) Appl. No.: 15/526,213

(22) PCT Filed: Oct. 25, 2016

(86) PCT No.: PCT/CN2016/103209
§ 371 (c)(1),
(2) Date: May 11, 2017

(87) PCT Pub. No.: WO2017/097046
PCT Pub. Date: Jun. 15, 2017

(65) Prior Publication Data
US 2017/0330633 A1 Nov. 16, 2017

(30) Foreign Application Priority Data
Dec. 9, 2015 (CN) .......................... 2015 1 0907055

(51) Int. Cl.
*G11C 19/00* (2006.01)
*G11C 19/18* (2006.01)
(Continued)

(52) U.S. Cl.
CPC ............ *G11C 19/186* (2013.01); *G09G 1/02* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS

2010/0177082 A1   7/2010 Joo et al.
2012/0212517 A1*  8/2012 Ahn ...................... G11C 19/28
                                                    345/690
(Continued)

FOREIGN PATENT DOCUMENTS

CN      104318904 A      1/2015
CN      104361860 A      2/2015
(Continued)

OTHER PUBLICATIONS

State Intellectual Property Office of the P.R.C (SIPO) Office Action 1 for 201510907055.5 dated Jun. 2, 2017 13 Pages (including translation).
(Continued)

*Primary Examiner* — Tuan T Lam
(74) *Attorney, Agent, or Firm* — Anova Law Group, PLLC

(57) ABSTRACT

The present disclosure provides a shift register, including: an input circuit, electrically connected to a triggering signal line that provides a triggering signal, a first clock signal line that provides a first clock signal, and a first node; configured for controlling whether the triggering signal is outputted to the first node based on the first clock signal; a control circuit, electrically connected to the first node, a second node, the first clock signal line, a second clock signal line that provides a second clock signal, and a turn-on signal line that provides a turn-on signal, configured for controlling whether the turn-on signal is outputted to the second node; and an output circuit, electrically connected to the first node, the second node, a first signal line that provides a first signal, a (Continued)

second signal line that provides a second signal, and a driving signal output line that outputs a driving signal.

12 Claims, 8 Drawing Sheets

(51) Int. Cl.
*G11C 19/28* (2006.01)
*G09G 1/02* (2006.01)
*G09G 3/20* (2006.01)
*G09G 3/36* (2006.01)

(52) U.S. Cl.
CPC ... *G09G 3/3677* (2013.01); *G09G 2310/0267* (2013.01); *G09G 2310/0286* (2013.01)

(56) References Cited

U.S. PATENT DOCUMENTS

| | | | | |
|---|---|---|---|---|
| 2013/0002306 | A1* | 1/2013 | Chung | G09G 3/3266 327/108 |
| 2013/0222352 | A1* | 8/2013 | Jeong | G09G 3/3266 345/205 |
| 2016/0329015 | A1 | 11/2016 | Ji et al. | |
| 2016/0351150 | A1 | 12/2016 | Ma | |
| 2016/0372042 | A1* | 12/2016 | Ma | G09G 3/20 |
| 2017/0004771 | A1* | 1/2017 | Lee | G09G 3/20 |
| 2017/0004889 | A1* | 1/2017 | Li | G11C 19/28 |
| 2017/0140836 | A1 | 5/2017 | Ma | |
| 2017/0200418 | A1* | 7/2017 | Zhang | G11C 19/28 |
| 2017/0200419 | A1* | 7/2017 | Ma | G09G 3/3266 |
| 2017/0201407 | A1* | 7/2017 | Suh | H04L 1/0071 |
| 2017/0256204 | A1* | 9/2017 | Xiang | G09G 3/3258 |
| 2017/0278450 | A1* | 9/2017 | Ma | G09G 3/2092 |
| 2017/0287388 | A1* | 10/2017 | Ma | G09G 3/20 |
| 2017/0301407 | A1 | 10/2017 | Ma | |
| 2018/0082623 | A1* | 3/2018 | Wang | G09G 3/3266 |
| 2018/0090072 | A1* | 3/2018 | Sun | G09G 3/3258 |
| 2018/0130541 | A1* | 5/2018 | Li | G09G 5/003 |
| 2018/0130542 | A1* | 5/2018 | Li | G09G 5/003 |
| 2018/0174521 | A1* | 6/2018 | Zheng | G09G 3/20 |
| 2018/0211716 | A1* | 7/2018 | Ma | G09G 3/20 |

FOREIGN PATENT DOCUMENTS

| | | |
|---|---|---|
| CN | 104835450 A | 8/2015 |
| CN | 104835531 A | 8/2015 |
| CN | 105096808 A | 11/2015 |
| CN | 105304057 A | 2/2016 |
| CN | 205247873 U | 5/2016 |
| JP | 2001228830 A | 8/2001 |
| WO | 2017097046 A1 | 6/2017 |

OTHER PUBLICATIONS

The World Intellectual Property Organization (WIPO) International Search Report and Written Opinion for PCT/CN2016/103209 dated Jan. 26, 2017 13 Pages.
The European Patent Office (EPO) The Extended European Search Report for 16863187.7 dated Apr. 24, 2019 12 Pages.

* cited by examiner

SHIFT REGISTER, GATE DRIVING CIRCUIT CONTAINING THE SAME, AND METHOD FOR DRIVING THE SAME

CROSS-REFERENCES TO RELATED APPLICATIONS

This application is a national phase entry under 35 U.S.C. § 371 of PCT patent application No. PCT/CN2016/103209, filed on Oct. 25, 2016, which claims priority of Chinese Patent Application No. 201510907055.5, filed on Dec. 9, 2015, the entire contents of both of which are incorporated herein by reference.

TECHNICAL FIELD

The present invention generally relates to the display technologies and, more particularly, relates to a shift register, a gate driving circuit containing the shift register, and a method for driving the shift register.

BACKGROUND

In array substrates used in flat display devices such as liquid crystal display (LCD) devices and organic light-emitting diode (OLED) display devices, gate lines are often controlled by a gate driver on array (GOA). The GOA often includes a plurality of cascading shift registers, which are controlled through one or more clock signals, e.g., pulse signals. However, in conventional technology, it is difficult to flexibly adjust the pulse width of the triggering signal for a shift register. As the driving flexibility of gate drivers becomes more desired, conventional shift registers need to be improved.

BRIEF SUMMARY

The present disclosure provides a shift register, a gate driving circuit containing the shift register, and a method for driving the shift register. By using the disclosed devices and method, the pulse width of the output signal of a shift register may be more flexibly adjusted.

One aspect of the present disclosure includes a shift register, including: an input circuit, electrically connected to a triggering signal line that provides a triggering signal, a first clock signal line that provides a first clock signal, and a first node, and used for controlling whether the triggering signal is outputted to the first node based on the first clock signal; a control circuit, electrically connected to the first node, a second node, the first clock signal line, a second clock signal line that provides a second clock signal, and a turn-on signal line that provides a turn-on signal, and used for controlling whether the turn-on signal is outputted to the second node; and an output circuit, electrically connected to the first node, the second node, a first signal line that provides a first signal, a second signal line that provides a second signal, and a driving signal output line that outputs a driving signal, and configured for responding to signals at the first node and the second node, selecting one of the first signal or the second signal as the driving signal, and providing the driving signal to the driving signal output line.

Optionally, the input circuit includes a first transistor. The first transistor includes a gate electrode electrically connected to the first clock signal line, a drain electrode electrically connected to the first node, and a source electrode electrically connected to the triggering signal line.

Optionally, the control circuit includes a first control unit and a second control unit. The first control unit is electrically connected to the first node, the second node, the first clock signal line, the second clock signal line, and the turn-on signal line, configured for controlling whether the turn-on signal is outputted to the second node; and the second control unit is electrically connected to the first signal line, the first node and the second node, configured for controlling whether the first signal is outputted to the second node.

Optionally, the first unit includes a third transistor, a fourth transistor, a fifth transistor, and a first capacitor. The third transistor has a gate electrode electrically connected to the first clock signal line, a source electrode electrically connected to the turn-on signal line, and a drain electrode electrically connected to a third node. The fourth transistor has a gate electrode electrically connected to the second clock signal line, a source electrode electrically connected to the turn-on signal line, and a drain electrode electrically connected to a source electrode of the fifth transistor. The fifth transistor includes a gate electrode electrically connected to the third node, a drain electrode electrically connected to the second node, and a source electrode electrically connected to the drain electrode of the fourth transistor. The first capacitor includes a first terminal electrically connected to the turn-on signal line and a second terminal electrically connected to the third node.

Optionally, the second control unit includes a sixth transistor. The sixth transistor includes a gate electrode electrically connected to the first node, a source electrode electrically connected to the first signal line, and a drain electrode electrically connected to the second node.

Optionally, the output circuit includes a first output unit and a second output unit. The first output unit is electrically connected to the first signal line, the second node, and the driving signal output line, configured for controlling the first signal to the driving signal output line based on a voltage of the second node; and the second output unit is electrically connected to the second signal line, the first node, and the driving signal output line, configured for controlling the second signal to the driving signal output line based on a voltage of the first node.

Optionally, the first output unit includes a seventh transistor and a second capacitor. The seventh transistor includes a gate electrode electrically connected to the second node, a drain electrode electrically connected to the driving signal output line, and a source electrode electrically connected to the first signal line; and the second capacitor includes a first terminal electrically connected to the first signal line and a second terminal electrically connected to the second node.

Optionally, the second output unit includes an eighth transistor and a third capacitor. The eighth transistor includes a gate electrode electrically connected to the first node, a drain electrode electrically connected to the driving signal output line, and a source electrode electrically connected to the second signal line; and the third capacitor includes a first terminal electrically connected to the driving signal output line and a second terminal electrically connected to the first node.

Optionally, the shift register further includes a voltage-rectifying circuit. The voltage-rectifying circuit is electrically connected to the first node, the second node, a third clock signal line that provides a third clock signal, and the first signal line, to respond to the signal at the second node and the third clock signal, and control the first signal to be transmitted to the first node.

Optionally, the voltage-rectifying circuit includes a ninth transistor and a tenth transistor. The ninth transistor includes a gate electrode electrically connected to the second node, a source electrode electrically connected to the first signal line, and a drain electrode electrically connected to a source electrode of the tenth transistor; and the tenth transistor includes a gate electrode electrically connected to the third clock signal line, a drain electrode electrically connected to the first node, and the source electrode electrically connected to the drain electrode of the ninth transistor.

Another aspect of the present disclosure provides a gate driving circuit, including one or more of the cascading shift registers disclosed by the present disclosure.

Another aspect of the present disclosure provides a method for driving the disclosed shift register. The method includes controlling the input circuit to output the triggering signal to the first node; controlling the input circuit to outputting no signal to maintain the first node at a first voltage level, and controlling the control circuit to output the turn-on signal to the second node or to maintain the second node at a second voltage level, so that the output circuit, in response to the turn-on signal, outputs the first signal to the driving signal output line, the first signal having a same pulse width as the triggering signal; and controlling the input circuit to output the triggering signal to the first node, wherein the control circuit, in response to the triggering signal, provides the first signal to the second node, and the output circuit, in response to the triggering signal, provides the second signal to the driving signal output line.

Optionally, controlling the input circuit to output the triggering signal to the first node is implemented in a triggering phase; controlling the input circuit to outputting no signal to maintain the first node at a first voltage level, and controlling the control circuit to output the turn-on signal to the second node or to maintain the second node at a second voltage level is implemented in a shifting phase; and controlling the input circuit to output the triggering signal to the first node is implemented in an ending phase.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
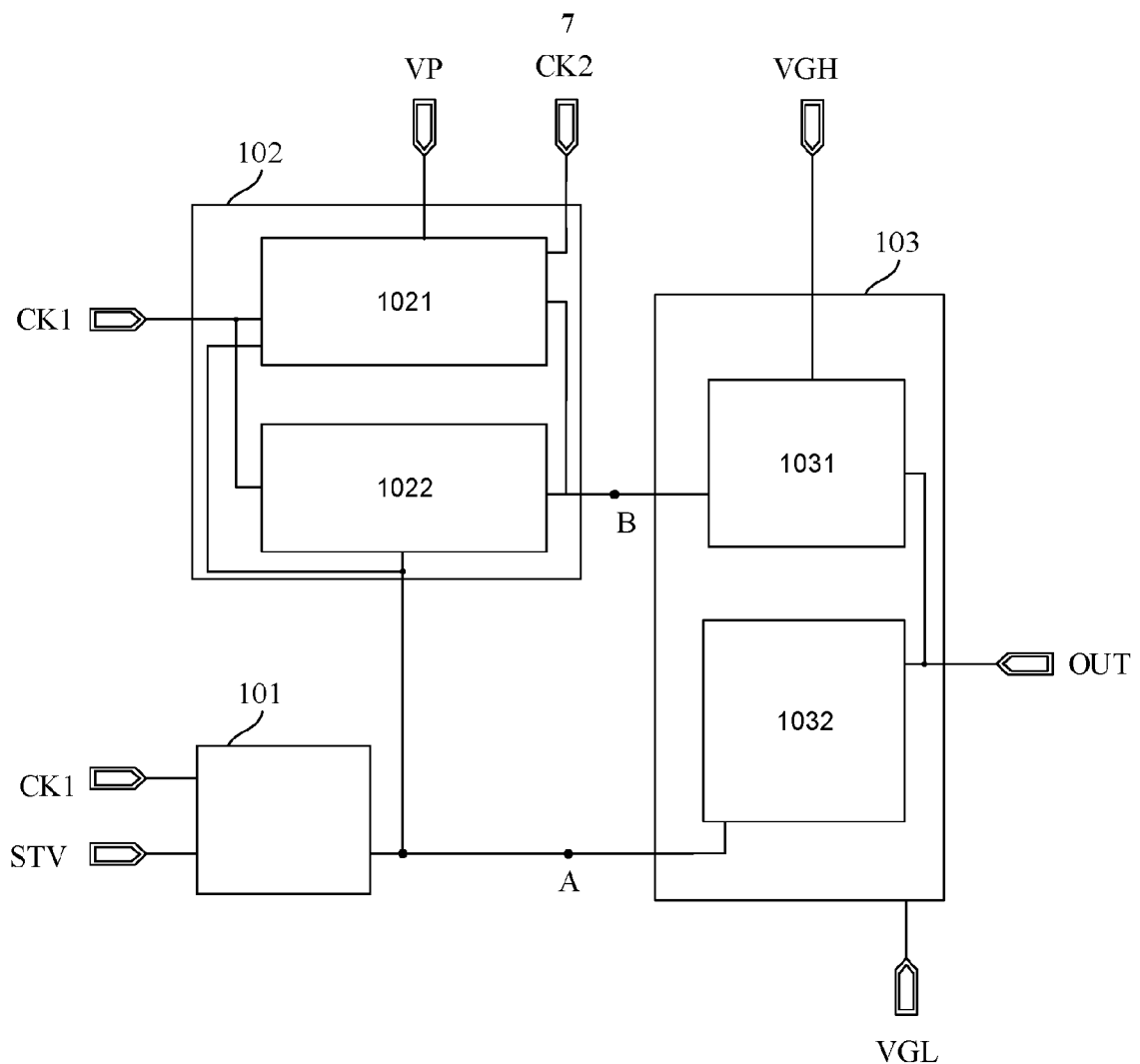
FIG. 1 illustrates an exemplary shift register according to various disclosed embodiments of the present disclosure.

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

The gate driver on array (GOA) often includes a plurality of cascading shift registers, which are controlled through one or more clock signals, e.g., pulse signals. The output terminal of a shift register of each level may be electrically connected to a gate line and the input terminal of the shift register of the next level. When the shift register of a level outputs a turn-on voltage, the shift register of the next level may be triggered such that the shift register of the next level may output a turn-on voltage in the next duty cycle. Accordingly, the gate lines can be turned on in a desired sequence.

In conventional technology, positive logic shift registers are often used in low temperature polysilicon active matrix organic light-emitting diode (LTPS-AMOLED) display devices. For these positive-logic shift registers, the pulse width of a triggering signal, e.g., the width of the high voltage level voltage in the triggering signal, is often in accordance with the width of a clock signal. When the pulse width of the triggering signal needs to be changed or adjusted, the pulse width of the output signal of the shift register and the pulse width of the clock signal may be adjusted at the same time. As a result, in conventional technology, it is difficult to flexibly adjust the pulse width of the triggering signal for a shift register. However, as the driving flexibility of gate drivers becomes more desired, conventional shift registers need to be improved.

One aspect of the present disclosure provides a shift register. The shift register may include an input circuit, electrically connected to a triggering signal line that provides a triggering signal, a first clock signal line that provides a first clock signal, and a first node. The input circuit may be configured for controlling whether the triggering signal is outputted to the first node based on the first clock signal. The shift register may also include a control circuit, electrically connected to the first node, a second node, the first clock signal line, a second clock signal line that provides a second clock signal, and a turn-on signal line that provides a turn-on signal. The control circuit may be configured for controlling whether the turn-on signal is outputted to the second node. The shift register may further include an output circuit, electrically connected to the first node, the second node, a first signal line that provides a first signal, a second signal line that provides a second signal, and a driving signal output line that outputs a driving signal. The output circuit may be configured for responding to signals at the first node and the second node, selecting one of the first signal and the second signal as the driving signal, and providing the driving signal to the driving signal output line.

In some embodiments, the first signal line may be a high-level signal line that provides a high-level signal, and the second signal may be a low-level signal line that provides a low-level signal. In some embodiments, the first signal line may be a low-level signal line that provides a low-level signal, and the second signal line may be a high-level signal line that provides a high-level signal.

As shown in FIG. 1, the shift register may include an input circuit 101, a control circuit 102, and an output circuit 103, the first signal line may be a high-level signal line that provides a high-level signal VGH, and the second signal may be a low-level signal line that provides a low-level signal VGL.

The input circuit 101 may be electrically connected to a triggering signal line, a first clock signal line, and a first node A. The triggering signal line may provide triggering signals STV for the shift register. The first clock signal line may provide first clock signals CK1 for the shift register. The input circuit 101 may control whether a triggering signal STV, provided by the triggering signal line, is transmitted to the first node A.

The control circuit 102 may be electrically connected to the first node A, a second node B, the first clock signal line, a second clock signal line, and a turn-on signal line. The second clock signal line may provide second clock signals CK2 for the shift register. The turn-on signal line may provide turn-on signals VP to the control circuit 102. The control circuit 102 may control whether a turn-on signal VP, provided by the turn-on signal line, is transmitted to the second node B.

The output circuit 103 may be electrically connected to the first node A, the second node B, a high-level signal line or a first signal line, a low-level signal line or a second signal line, and a driving signal output line for outputting the driving signal OUT. The high-level signal line may provide a high-level signal VGH or a first signal VGH to the output circuit 103. The low-level signal line may provide a low-level signal VGL or a second signal VGL to the output circuit 103. The output circuit 103 may respond to the signals or voltages at the first node A and the second node B, select the high-level signal VGH as the driving signal OUT, and transmit the high-level signal VGH to the driving signal output line. The output circuit 103 may also respond to the signals or voltages at the first node A and the second node B, select the low-level signal VGL as the driving signal OUT, and transmit the low-level signal VGL to the driving signal output line.

In some embodiments, the input circuit 101 may be configured to control whether the triggering signal STV is transmitted to the first node A, and the control circuit 102 may be configured to control whether the turn-on signal VP is transmitted to the second node B. Thus, the output circuit 103 may respond to the signals or voltages at the first node A and the second node B, and select the high-level signal VGH or the low-level signal VGL as the driving signal OUT to be outputted. The output signal of the output circuit 103, i.e., the driving signal OUT, may be shifted and may have the same pulse width as the triggering signal STV. The pulse width of the output signal may change, as the pulse width of the triggering signal STV changes. Thus, the pulse width of the output signal, of the shift register, may be changed or adjusted with improved flexibility.

The input circuit 101, the control circuit 102, and the output circuit 103 may each have suitable hardware and/or software parts, e.g., circuit structures, to implement desired functions of the shift register.

For example, in some embodiments, the input circuit 101 may include a first transistor. The gate electrode of the first transistor may be electrically connected to the first clock signal line. The drain electrode of the first transistor may be electrically connected to the first node A. The source electrode of the first transistor may be electrically connected to the triggering signal line.

In some embodiments, the control circuit 102 may include a first control unit 1021. The first control unit may be electrically connected to the first node A, the second node B, the first clock signal line, the second clock signal line, and the turn-on signal line. The first control unit may control whether the turn-on signal VP is outputted to the second node B. The first control unit may include a second transistor, a third transistor, a fourth transistor, a fifth transistor, and/or a first capacitor. The first control unit may be electrically connected to the first node, the second node, the first clock signal line, the second clock signal line, and the turn-on signal line, and may be configured for controlling whether the turn-on signal is outputted to the second node.

The gate electrode of the second transistor may be electrically connected to the first node A. The source electrode of the second transistor may be electrically connected to the first clock signal line. The drain electrode of the second transistor may be electrically connected to a third node in the control circuit 102.

The gate electrode of the third transistor may be electrically connected to the first clock signal line. The source electrode of the third transistor, the source electrode of the fourth transistor, and a first terminal of the first capacitor may be electrically connected to the turn-on signal line. The drain electrode of the third transistor, a second terminal of the first capacitor, and the gate electrode of the fifth transistor may be electrically connected to the third node.

The gate electrode of the fourth transistor may be electrically connected to the second clock signal line. The drain electrode of the fourth transistor may be electrically connected to the source electrode of the fifth transistor.

The drain electrode of the fifth transistor may be electrically connected to the second node B.

In some embodiments, the control circuit 102 may further include a second control unit 1022. The second control unit may include a sixth transistor. The second control unit may be electrically connected to the high-level signal line, the first node and the second node, and may be configured for controlling whether the first signal is outputted to the second node. The gate electrode of the sixth transistor may be electrically connected to the first node A. The source electrode of the sixth transistor may be electrically connected to the high-level signal line. The drain electrode of the sixth transistor may be electrically connected to the second node B.

The output circuit 103 may include a first output unit 1031 and a second output unit 1032. The first output unit 1031 may be electrically connected to the high-level signal line, the second node, and the driving signal output line. The first output unit 1031 may control the high-level signal to the driving signal output line based on a voltage of the second node B. The second output unit 1032 may be electrically connected to the low-level signal line, the first node A, and the driving signal output line. The second output unit 1032 may control the low-level signal to the driving signal output line based on a voltage of the first node A.

The first output unit 1031 may include a seven transistor and a second transistor. The second output unit 1032 may include an eighth transistor and a third capacitor.

The drain electrode of the seventh transistor, the drain electrode of the eighth transistor, and a first terminal of the third capacitor may be electrically connected to the driving signal output line.

The gate electrode of the eighth transistor and a second terminal of the third capacitor may be electrically connected to the first node A.

The seventh transistor and the second capacitor may form a first output unit for transmitting the high-level signal VGH as the driving signal OUT, and the eighth transistor and the third capacitor may form a second output unit for transmitting the low-level signal VGH as the driving signal OUT.

The source electrode of the seventh transistor and a first terminal of the second capacitor may be electrically connected to the high-level signal line. The gate electrode of the seventh transistor and a second terminal of the second capacitor may be electrically connected to the second node B.

The circuits of the input circuit 101, the control circuit 102, and the output circuit 103 may be configured to implement desired functions of the shift register. The input circuit 101 may control whether the triggering signal STV is transmitted to the first node A. The control circuit 102 may control whether the turn-on signal VP is transmitted to the second node B. Thus, the output circuit 103 may respond to the signals at the first node A and the second node B, and select the high-level signal VGH or the low-level signal VGL as the driving signal OUT. The driving signal OUT may be outputted by the shift register. The output driving signal OUT of the output circuit 103 may be shifted and may have the same pulse width as the triggering signal STV. That is, the pulse width of the output signals may change as the pulse width of the triggering signal STV changes. The pulse width of the output signal, of the shift register, may be changed or adjusted with improved flexibility.

Figure 2:
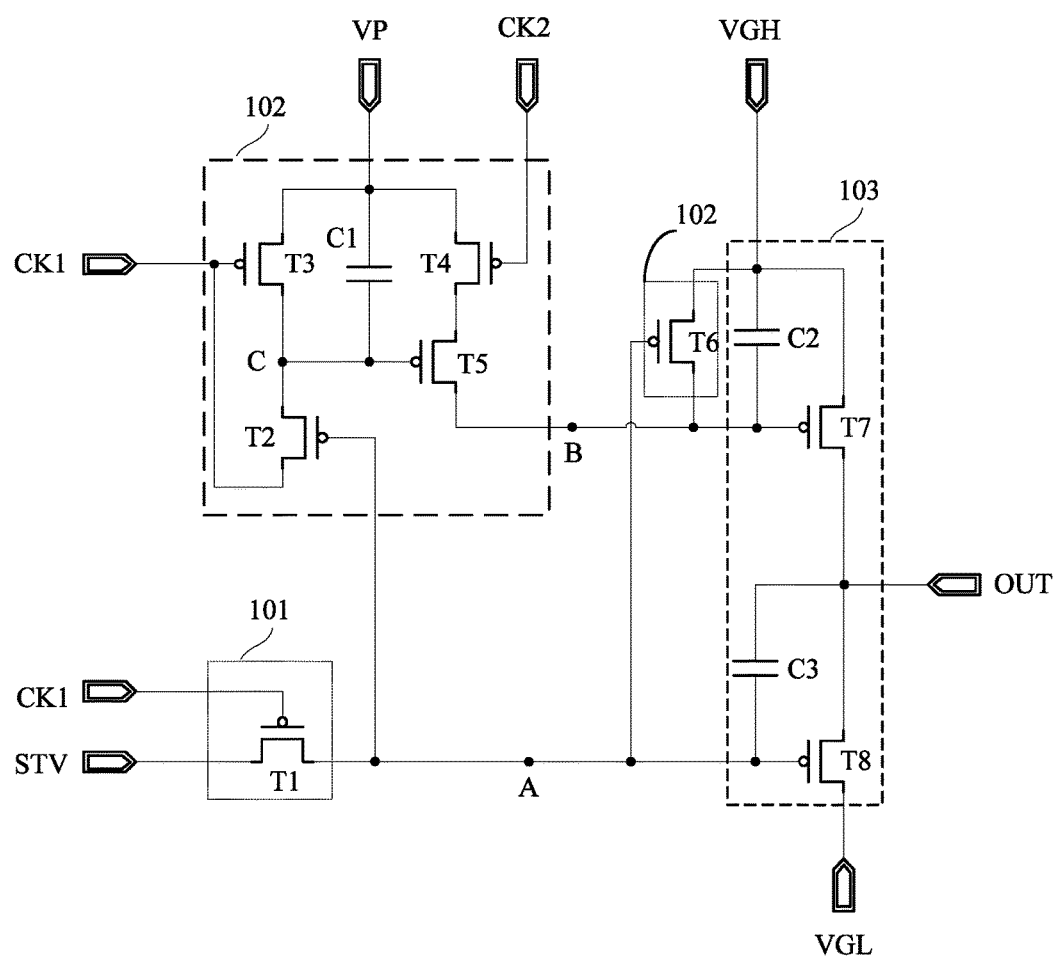
FIG. 2 illustrates an exemplary circuit diagram of the shift register illustrated in FIG. 1.

FIG. 2 illustrates an exemplary circuit diagram of the shift register. As shown in FIG. 2, the shift register may include a first transistor T1, a second transistor T2, a third transistor T3, a fourth transistor T4, a fifth transistor T5, a sixth transistor T6, a seventh transistor T7, an eighth transistor T8, a first capacitor C1, a second capacitor C2, and a third capacitor C3.

The gate electrode of the first transistor T1 may be electrically connected to the first clock signal line. The drain electrode of the first transistor T1 may be electrically connected to the first node A. The source electrode of the first transistor T1 may be electrically connected to the triggering signal line.

The gate electrode of the second transistor T2 may be electrically connected to the first node A. The source electrode of the second transistor T2 may be electrically connected to the first clock signal line. The drain electrode of the second transistor T2 may be electrically connected to a third node in the control circuit 102.

The gate electrode of the third transistor T3 may be electrically connected to the first clock signal line. The source electrode of the third transistor T3, the source electrode of the fourth transistor T4, and a first terminal of the first capacitor C1 may be electrically connected to the turn-on signal line. The drain electrode of the third transistor T3, a second terminal of the first capacitor C1, and the gate electrode of the fifth transistor T5 may be electrically connected to the third node.

The gate electrode of the fourth transistor T4 may be electrically connected to the second clock signal line. The drain electrode of the fourth transistor T4 may be electrically connected to the source electrode of the fifth transistor T5.

The drain electrode of the fifth transistor T5 may be electrically connected to the second node B.

The gate electrode of the sixth transistor T6 may be electrically connected to the first node A. The source electrode of the sixth transistor T6, the source electrode of the seventh transistor T7, and a first terminal of the second capacitor C2 may be electrically connected to the high-level signal line VGH. The drain electrode of the sixth transistor T6, the gate electrode of the seventh transistor T7, and the second terminal of the second capacitor T2 may be electrically connected to the second node B.

The drain electrode of the seventh transistor T7, the drain electrode of the eighth transistor T8, and the first terminal of the third capacitor C3 may be electrically connected to the driving signal output line.

The gate electrode of the eighth transistor T8 and the second terminal of the third capacitor C3 may be electrically connected to the first node A.

In some embodiments, the transistors, i.e., transistors T1-T8, may be P-type transistors, and the turn-on signal VP may be low-level signal. In some other embodiments, the transistors, i.e., transistors T1-T8, may be N-type transistors and the turn-on signal VP may be high-level signal. The specific types of transistors used in the shift register should be determined according to different applications and should not be limited according to various embodiments of the present disclosure.

Figure 3:
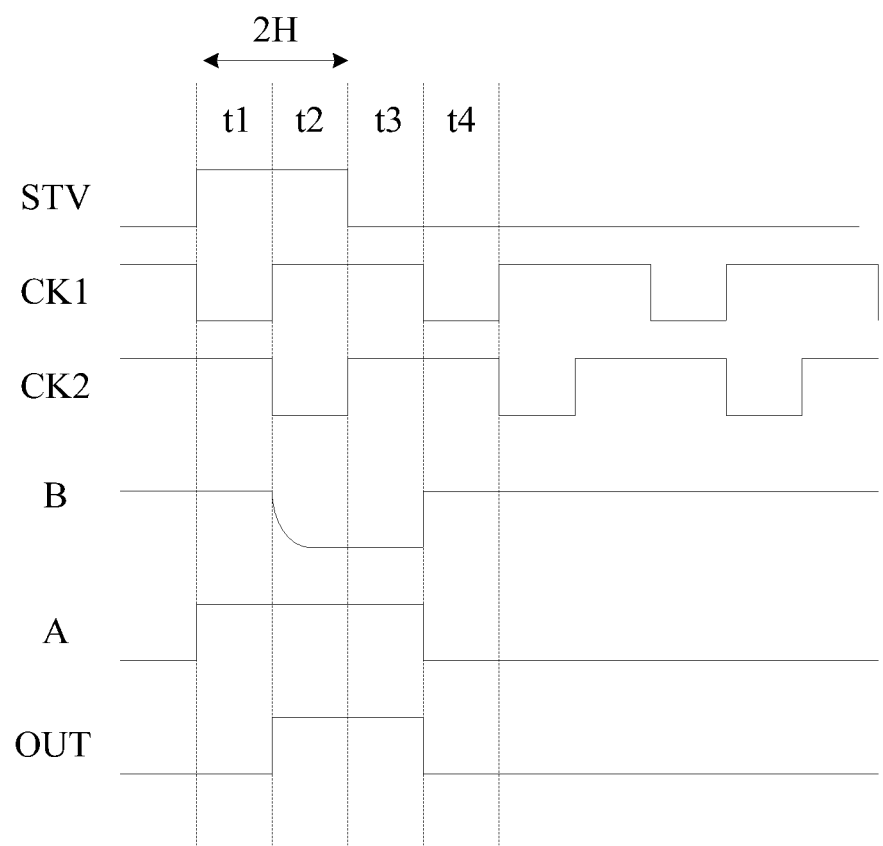
FIG. 3 illustrates a timing diagram for driving the shift registers illustrated in FIG. 2.

The shift register exemplified in FIG. 2 may be operated under the timing diagram shown in FIG. 3. For example, the duration of a gate scanning duration may be H, and the pulse width of a triggering signal STV may be twice the gate scanning duration. That is, the triggering signal STV may have a pulse width of 2H. Details of the operations are illustrated in FIGS. 2 and 3.

As shown in FIG. 3, in the first duration t1, the first clock signal CK1 may be of low voltage level. The triggering signal STV and the second clock signal CK2 may be of high voltage level. The first transistor T1 may be turned on so that the triggering signal STV may be transmitted to the first node A. The first node A may be of high voltage level. The second transistor T2, the fourth transistor T4, the sixth transistor T6, and the eighth transistor T8 may be turned off The third transistor T3 may be turned on so that the turn-on signal VP may be transmitted to the third node C. The voltage at node C may be of low voltage level, which may turn on the fifth transistor T5.

Because of the scanning of the last frame and the second capacitor C2 maintaining the state of the last gate scanning duration H, the second node B may be of high voltage level. The seventh transistor T7 may be turned off Meanwhile, because the third capacitor C3 maintains at the state of the last gate scanning duration H, the driving signal OUT may maintain at the state in the last frame. The outputted driving signal OUT may maintain at the state of the last gate scanning duration H and may be of low-level signal.

Further, in the second duration t2, the first clock signal CK1 and the triggering signal STV may be of high voltage level. The second clock signal CK2 may be of low voltage level. The fourth transistor T4 and the fifth transistor T5 may be turned on so that the turn-on signal VP may be transmitted to the second node B. The second node B may change to low voltage level.

The first node A may maintain at high voltage level. The third node C may maintain at low voltage level. The seventh transistor T7 may be turned on and the other transistors may be turned off so that the high-level signal VGH may be transmitted to the driving signal output line. That is, the driving signal OUT may be of high voltage level.

Further, in the third duration t3, the triggering signal STV may be of low voltage level. The first clock signal CK1 and the second clock signal CK2 may be of high voltage level. The first transistor T1 may be turned off so that the voltage at the first node A may maintain at high voltage level.

The fifth transistor T5 and the seventh transistor T7 may be turned on, and the other transistors may be turned off The second node B may maintain at low voltage level. The third node C may maintain at low voltage level. Because the seventh transistor T7 may be turned on, the high-level signal VGH may be transmitted to the driving signal output line. That is, the driving signal OUT may be of high voltage level.

Further, in the fourth duration t4, the triggering signal STV and the first clock signal CK1 may be of low voltage level. The second clock signal CK2 may be of high voltage level. The third transistor T3 may be turned on. The turn-on signal VP may be transmitted to the third node C so that the voltage at the third node C may be of low voltage level.

The first transistor T1 may be turned on so that the triggering signal STV may be transmitted to the first node A. The first node A may be of low voltage level so that the sixth transistor T6 may be turned on. The high-level signal VGH may be transmitted to the second node B and the voltage at the second node B may be of high voltage level.

Because the voltage at the first node A may be of low voltage level, the eighth transistor T8 may be turned on. Further, because the voltage at the second node B may be high voltage level, the seventh transistor T7 may be turned off. Thus, the low-level signal VGL may be transmitted to the driving signal output line through the eighth transistor T8. Thus, the driving signal OUT may be of low voltage level.

For triggering signals STV of different pulse widths, the operation of the shift register may also be referred to as the operation described above, i.e., operation with a triggering signal having a pulse width of 2 H. Thus, the pulse width of the triggering signal STV may be flexibly changed or adjusted to adapt to the more flexible gate scanning operations. Also, the pulse width of the consecutive high-level signal in the triggering signal STV should have a width greater than or equal to 2 H.

Figure 4:
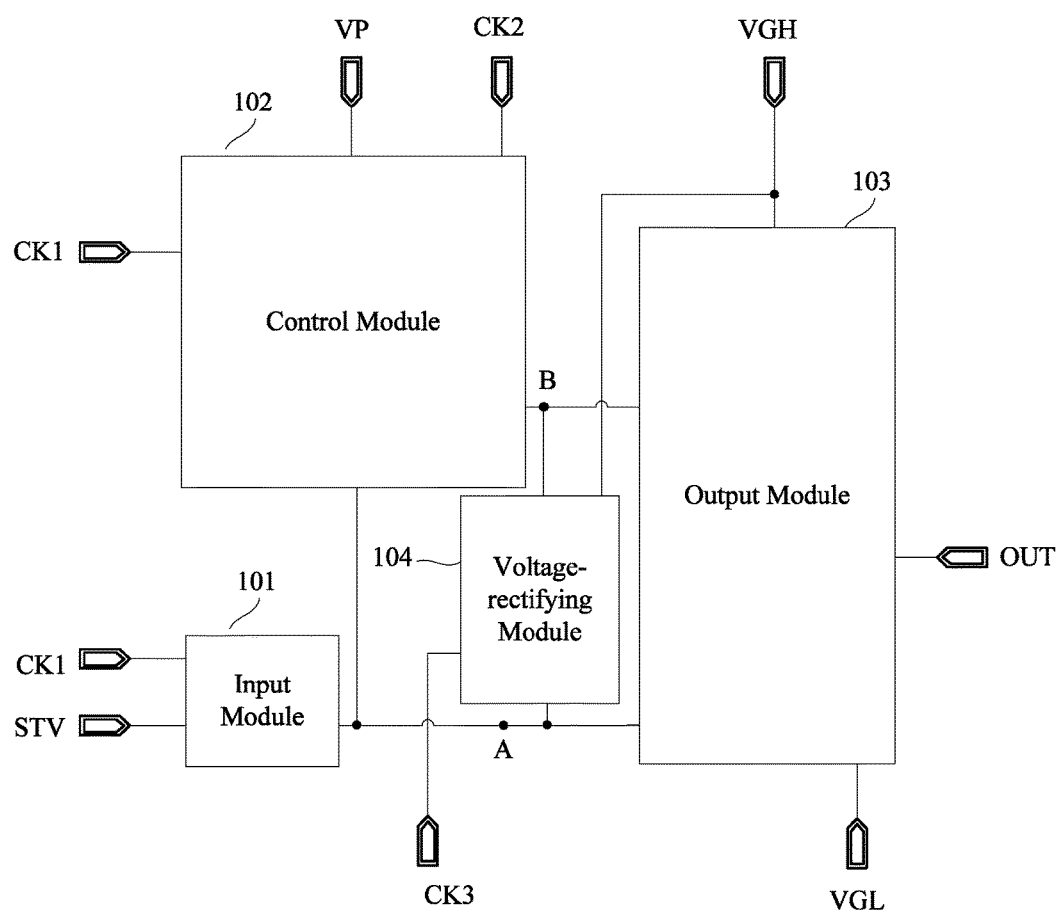
FIG. 4 illustrates another exemplary shift register according to various disclosed embodiments of the present disclosure.

FIG. 4 illustrates an exemplary structure of the shift register. As shown in FIG. 4, the shift register may include an input circuit 101, a control circuit 102, an output circuit 103, and a voltage rectifying circuit 104.

The input circuit 101 may be electrically connected to a triggering signal line, a first clock signal line, and a first node A. The triggering signal line may provide triggering signals STV to the shift register. The first clock signal line may provide a first clock signal CK1 to the shift register. The input circuit 101 may control whether the triggering signals STV, provided by the triggering signal line, is transmitted to the first node A.

The control circuit 102 may be electrically connected to the first node A, the second node B, the first clock signal line, a second clock signal line, and a turn-on signal line. The second clock signal line may provide second clock signals CK2 to the shift register. The turn-on signal line may provide turn-on signals VP to the shift register. The control circuit 102 may control whether the turn-on signals VP, provided by the turn-on signal line, are transmitted to the second node B.

The output circuit 103 may be electrically connected to the first node A, the second node B, high-level signal line, low-level signal line, and a driving signal output line for outputting the driving signal OUT. The high-level signal line may provide the high-level signal VGH to the output circuit 103. The low-level signal line may provide the low-level signal VGL to the output circuit 103. The output circuit 103 may respond to the signals or voltages at the first node A and the second node B. The output circuit 103 may select the high-level signal VGH, provided by the high-level signal line, as the driving signal OUT, and transmit the high-level signal VGH to the driving signal output line. The output circuit 103 may select the low-level signal VGL, provided by the low-level signal line, as the driving signal OUT, and transmit the low-level signal VGL to the driving signal output line.

The voltage-rectifying circuit 104 may be electrically connected to the first node A, the second node B, a third clock signal line, and the high-level signal line. The third clock signal line may provide a third clock signal CK3 to the shift register. The voltage-rectifying circuit 104 may respond to the voltage or signal at the second node B and the third clock signal CK3, to control whether the high-level signal VGH, provided by the high-level signal line, is transmitted to the first node A, such that the voltage level of the first node A may maintain high, and the high voltage level at the first node A may be more stable.

In the present disclosure, the input circuit 101 may control whether the triggering signals STV is transmitted to the first node A, and the control circuit 102 may control whether the turn-on signals VP is transmitted to the second node B. Thus, the output circuit 103 may respond to the signals or voltages at the first node A and the second node B, to select the high-level signal VGH or the low-level signal VGL as the driving signal OUT. The shift register may further output the driving signal OUT. Thus, the shift register may shift and adjust the driving signal OUT so that the driving signal OUT may have the same pulse width as the triggering signal STV. The pulse width of the driving signal OUT may change accordingly with the pulse width of the triggering signal STV. The width of the driving signal OUT, outputted by the shift register, may be adjusted more flexibly. Meanwhile, in operation, by providing a voltage-rectifying circuit 104, the voltage at the first node A may maintain at high voltage level in a desired period.

Figure 5:
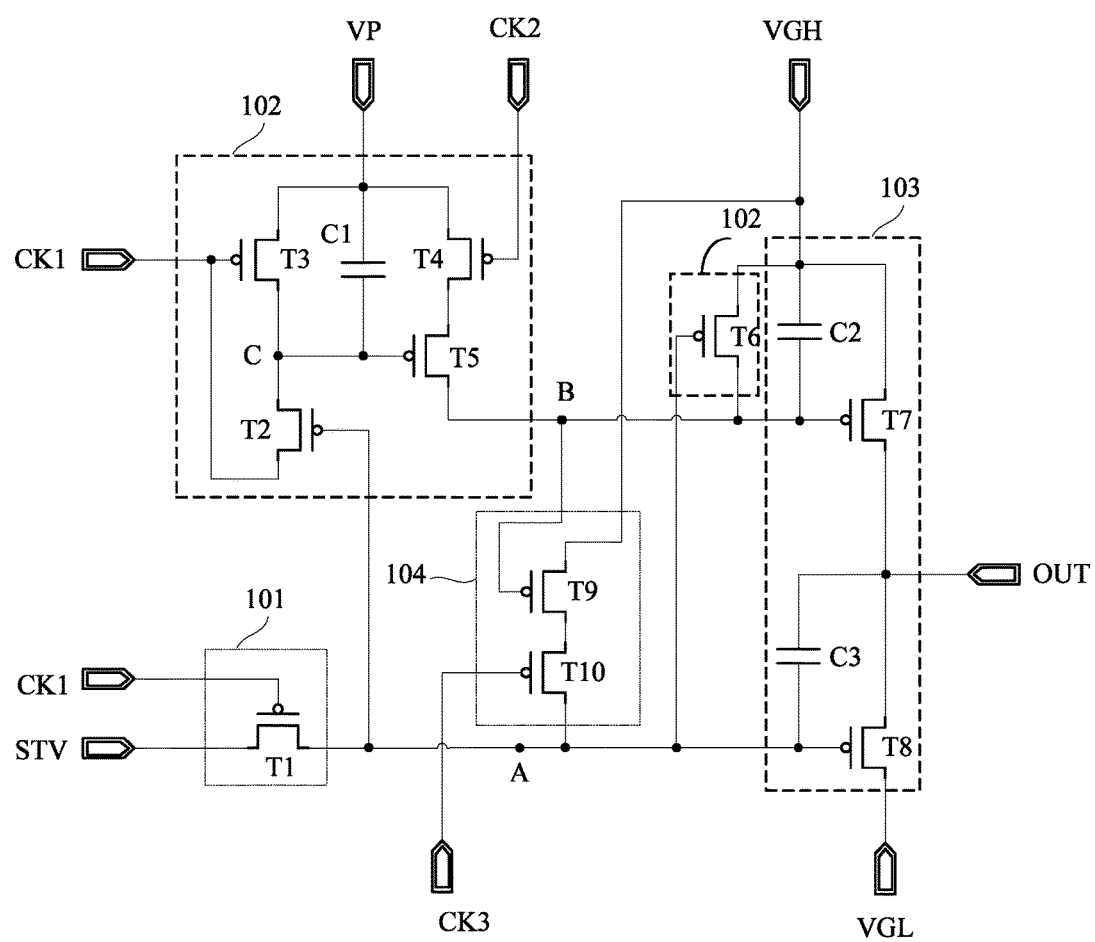
FIG. 5 illustrates an exemplary circuit diagram of the shift register illustrated in FIG. 4.

The parts and functions of the input circuit 101, the control circuit 102, and the output circuit 103 in FIGS. 4 and 5 may be similar to the parts and functions of the input circuit 101, the control circuit 102, and the output circuit 103 in FIGS. 1 and 2. The description of the input circuit 101, the control circuit 102, and the output circuit 103 shown in FIGS. 4 and 5 may be referred to the description of the corresponding circuits shown in FIGS. 1 and 2, and are not repeated herein. FIG. 5 illustrates a circuit diagram of the shift register exemplified in FIG. 4.

As shown in FIG. 5, the shift register may further include a voltage-rectifying circuit 104 and a third clock signal line. The third clock signal line may provide third clock signals CK3 to the shift register. The voltage-rectifying circuit 104 may include a ninth transistor T9 and a tenth transistor T10. The gate electrode of the ninth transistor T9 may be electrically connected to the second node B. The source electrode of the ninth transistor T9 may be electrically connected to the high-level signal line. The drain electrode of the ninth transistor T9 may be electrically connected to the source electrode of the tenth transistor T10. The gate electrode of the tenth transistor T10 may be electrically connected to the third clock signal CK3. The drain electrode of the tenth transistor T10 may be electrically connected to the first node A.

In the first duration t1, the first clock signal CK1 may be of low voltage level. The triggering signal STV, the second clock signal CK2, and the third clock signal CK3 may be of high voltage level. The second node B may be of high voltage level and node C may be of low voltage level. The first node A may be of high voltage level because of the storage function of the first capacitor C1. The first transistor T1, the second transistor T2, the fifth transistor T5, the seventh transistor T7, the eighth transistor T8, the ninth transistor T9, and the tenth transistor T10 may be turned off, and the sixth transistor T6 may be turned on. Because of parasitic capacitance, the outputted driving voltage OUT may maintain at low voltage level.

Further, in the second duration t2, the first clock signal CK1, the triggering signal STV, and the third clock signal CK3 may be of high voltage level. The second clock signal CK2 may be of low voltage level. The first node A may change to low voltage level. The second node B and the third node C may maintain at their previous voltage levels. The first transistor T1 and the ninth transistor T9 may be turned on, and the rest of the transistors may be turned off. The outputted driving signal OUT may be of high voltage level.

Further, in the third duration t3, the triggering signal STV and the third clock signal CK3 may be of low voltage level. The first clock signal CK1 and the second clock signal CK2 may be of high voltage level. The first node A and the third node C may be of low voltage level. The second node B may be of high voltage level. The first transistor T1, the sixth transistor T6, the ninth transistor T9, and the tenth transistor T10 may be turned on, and the rest of the transistors may be turned off. The outputted driving signal OUT may be of high voltage level.

Further, in the fourth duration t4, the triggering signal STV and the first clock signal CK1 may be of low voltage level. The second clock signal CK2 and the third clock signal CK3 may be of high voltage level. The fifth transistor T5 may be turned off. The low-level signal VGL may not be able to be written into the first node A. The third transistor T3 may be turned on and the second node B may become low voltage level. The seventh transistor T7 may be turned on and the first node A may have high voltage level. The first transistor T1 may be turned off and the second transistor T2 may be turned on. The outputted driving signal OUT may be of low voltage level.

In some embodiments, the transistors, e.g., transistors T1-T10, may be P-type transistors, and the turn-on signal VP may be low-level signal. In some other embodiments, the transistors, e.g., transistors T1-T10, may be N-type transistors and the turn-on signal VP may be high-level signal. The specific types of transistors used in the shift register should be determined according to different applications and should not be limited by the embodiments of the present disclosure.

Figure 6:
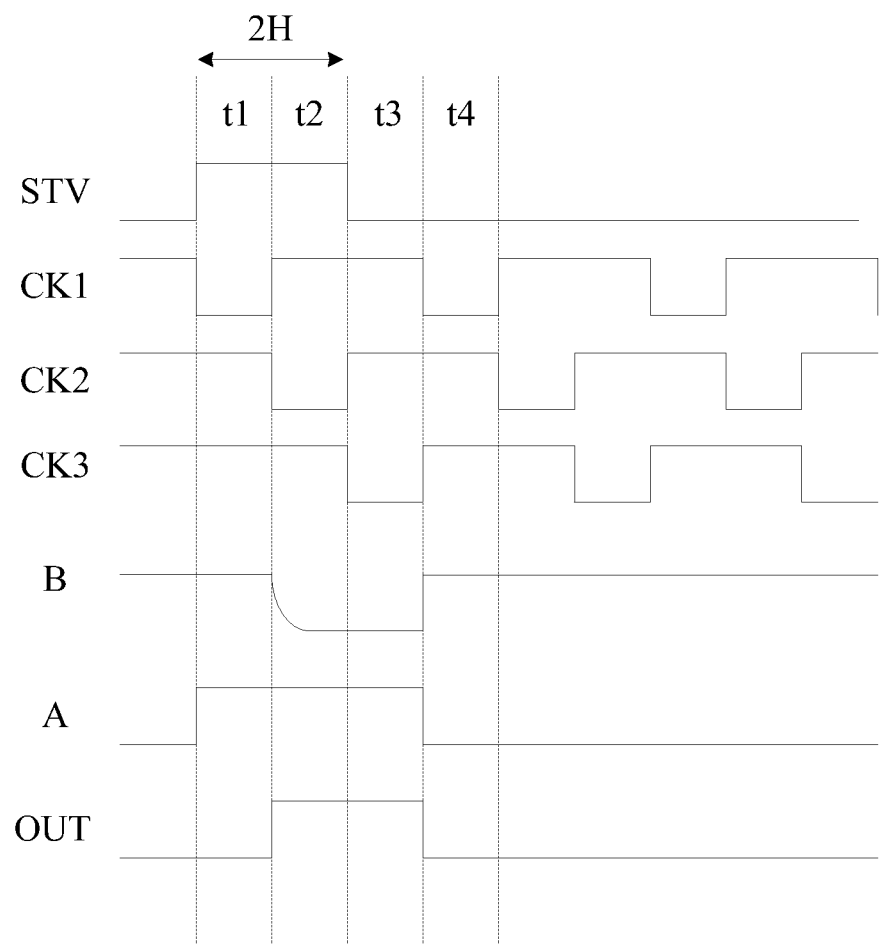
FIG. 6 illustrates a timing diagram for driving the shift registers illustrated in FIG. 5.
Figure 7:
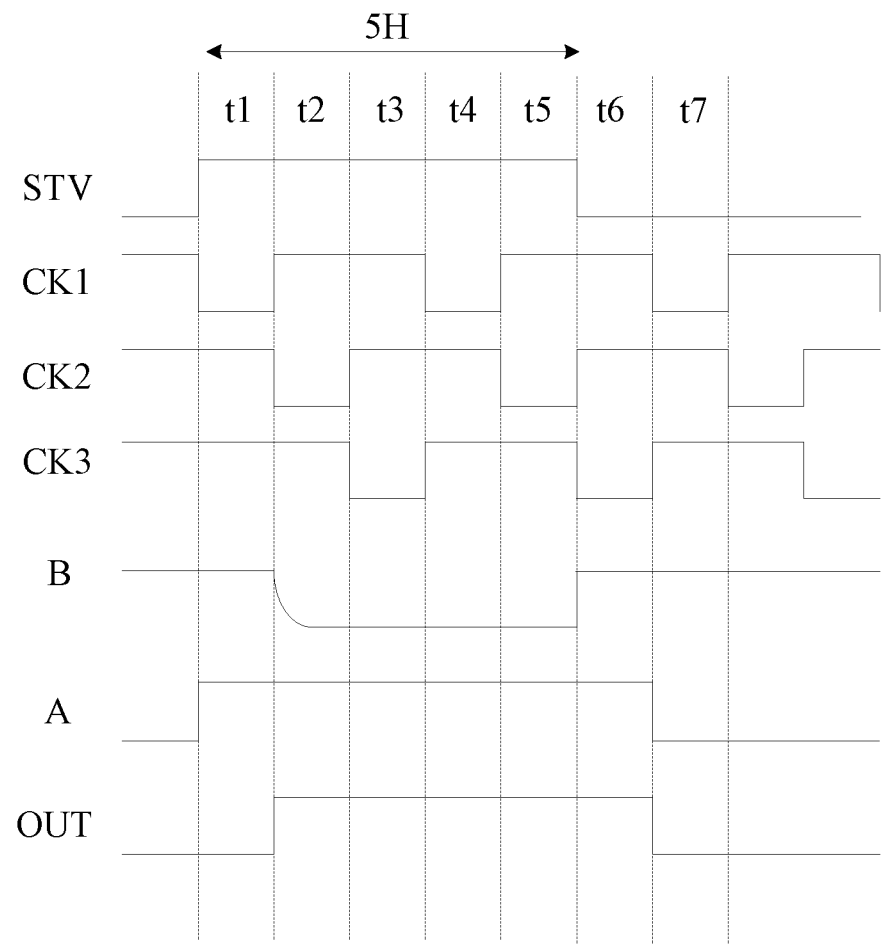
FIG. 7 illustrates another timing diagram for driving the shift registers illustrated in FIG. 5.

In some embodiments, the voltage-rectifying circuit 104 may be incorporated in the shift register when sufficient layout space is available. The voltage-rectifying circuit 104 may keep a stable voltage level at the first node A. Except for maintaining the voltage level at the first node A, the shift register shown in FIGS. 4 and 5 may have the same working principles as the shift register shown in FIGS. 1 and 2. The functions and operations at different timing duties may be referred to the shift register shown in FIGS. 1-3. When the pulse width of the triggering signal STV is 2 H, the timing diagram of the shift register shown in FIGS. 4 and 5 is shown in FIG. 6. FIG. 6 includes the timing of the third clock signal CK3. In various embodiments of the present disclosure, the pulse width of the triggering signal STV may vary. For example, a triggering signal STV with a pulse width of 5 H is shown in FIG. 7. As shown in FIG. 7, the driving signal OUT may be shifted in accordance to the triggering signal STV. The working principles when the pulse width of the triggering signal STV is 5 H may be similar to the working principles when the pulse width of the triggering signal STV is 2 H, and details are not repeated herein.

The disclosed shift register has several advantages. For example, the input circuit may be configured to control whether the triggering signal is transmitted to the first node, and the control circuit may be configured to control whether the turn-on signal is transmitted to the second node. Thus, the output circuit may respond to the signals at the first node and the second node, and select the high-level signal or the low-level signal as the driving signal to be outputted. The output signal of the output circuit may be shifted to have the same pulse width as the triggering signal. The pulse width of the output signals may change, as the pulse width of the triggering signal changes. The pulse width of the output signal, of the shift register, may be changed or adjusted with improved flexibility.

Another aspect of the present disclosure provides a gate driving circuit. The gate driving circuit may include a plurality of cascading shift registers provided by the present disclosure.

Another aspect of the present disclosure provides a method for driving a shift register. The shift register may be illustrated in FIGS. 1-2, 4-5, and 7. The operation of the shift register may include a triggering phase, a shifting phase, and an ending phase.

In the triggering phase, the input circuit may be controlled to transmit the triggering signal to the first node. The triggering signal may be at high voltage level.

In the shifting phase, the input circuit may be controlled not to output any signal so that the voltage at the first node may maintain at high voltage level. The control circuit may be controlled to transmit the turn-on signal to the second node, or keep the voltage at the second node at low voltage level. Thus, the output circuit may respond to the turn-on signal outputted by the control circuit to output the high-level signal to the driving signal output line, where the high-level signal has a same pulse width as the triggering signal.

In the ending phase, the input circuit may be controlled to transmit the triggering signal to the first node so that the control circuit may respond to the triggering signal sent by the input circuit and transmit the high-level signal to the second node. Thus, the output circuit may respond to the triggering signal sent by the input circuit to transmit the low-level signal to the driving signal output line.

The disclosed method for driving a shift register has several advantages. For example, the input circuit may be configured to control whether the triggering signal is transmitted to the first node, and the control circuit may be configured to control whether the turn-on signal is transmitted to the second node. Thus, the output circuit may respond to the signals at the first node and the second node, and select the high-level signal or the low-level signal as the driving signal to be outputted. The output signal of the output circuit may be shifted to have the same pulse width as the triggering signal. The pulse width of the output signals may change, as the pulse width of the triggering signal changes. The pulse width of the output signal, of the shift register, may be changed or adjusted with improved flexibility.

Figure 8:
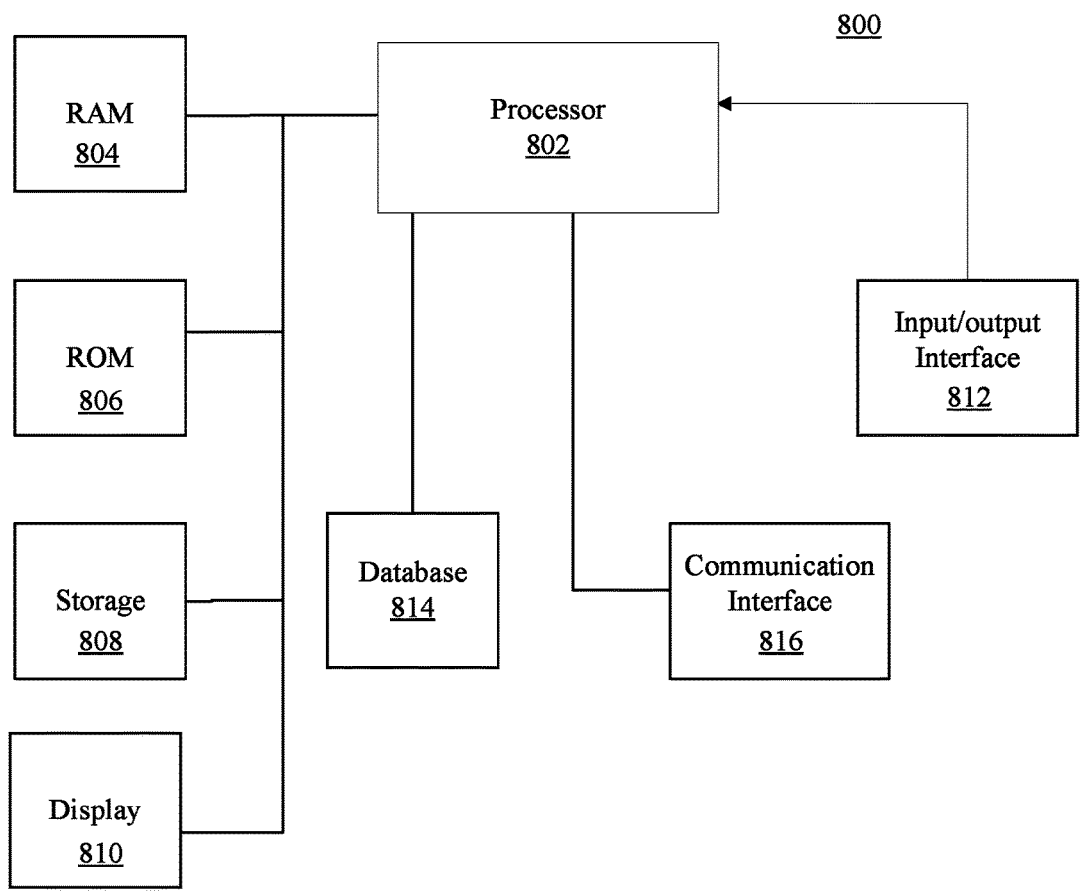
FIG. 8 illustrates an exemplary control circuit used in various disclosed embodiments of the present disclosure.

FIG. 8 illustrates the block diagram of a processing circuit used in various embodiments of the present disclosure.

The processing circuit may receive, process, and execute commands from/to the shift register. The processing circuit may include any appropriately configured computer system. As shown in FIG. 8, the processing circuit may include a processor 802, a random access memory (RAM) 804, a read-only memory (ROM) 806, a storage 1208, a display 810, an input/output interface 812, a database 814; and a communication interface 816. Other components may be added and certain devices may be removed without departing from the principles of the disclosed embodiments.

Processor 802 may include any appropriate type of general purpose microprocessor, digital signal processor or microcontroller, and application specific integrated circuit (ASIC). Processor 802 may execute sequences of computer program instructions to perform various processes associated with processing circuit. Computer program instructions may be loaded into RAM 804 for execution by processor 802 from read-only memory 806, or from storage 808. Storage 808 may include any appropriate type of mass storage provided to store any type of information that processor 802 may need to perform the processes. For example, storage 808 may include one or more hard disk devices, optical disk devices, flash disks, or other storage devices to provide storage space.

Display 810 may provide information to a user or users of the processing circuit. Display 810 may include any appropriate type of computer display device or electronic device display (e.g., CRT or LCD based devices). Input/output interface 812 may be provided for users to input information into processing circuit or for the users to receive information from processing circuit. For example, input/output interface 812 may include any appropriate input device, such as a keyboard, a mouse, an electronic tablet, voice communication devices, touch screens, or any other optical or wireless input devices. Further, input/output interface 812 may receive from and/or send to other external devices.

Further, database 814 may include any type of commercial or customized database, and may also include analysis tools for analyzing the information in the databases. Database 814 may be used for storing information for semiconductor manufacturing and other related information. Communication interface 816 may provide communication connections such that processing circuit may be accessed remotely and/or communicate with other systems through computer networks or other communication networks via various communication protocols, such as transmission control protocol/internet protocol (TCP/IP), hyper text transfer protocol (HTTP), etc.

In one embodiment, the processing circuit may send clock signals, i.e., CLK1-CLK3, and a triggering signal STV, to the disclosed shift register through the input/output interface 812. The duration of the triggering signal STV may be controlled or pre-programmed, and stored in the storage 808. Based on the voltages/signals at the first node A and the second node B, the processor 802 may perform suitable calculations and determine whether the high-level signal VGH or the low-level signal VGL can be selected as the outputted driving signal OUT.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A shift register, comprising:
    an input circuit, electrically connected to a triggering signal line that provides a triggering signal, a first clock signal line that provides a first clock signal, and a first node, configured for controlling whether the triggering signal is outputted to the first node based on the first clock signal;
    a control circuit comprising a first control unit and a second control unit, wherein:
        the first control unit including a third transistor, a fourth transistor, a fifth transistor, and a first capacitor, configured for controlling whether a turn-on signal is outputted to a second node,
        the third transistor has a gate electrode electrically connected to the first clock signal line, a source electrode electrically connected to a turn-on signal line that provides the turn-on signal, and a drain electrode electrically connected to a third node,
        the fourth transistor has a gate electrode electrically connected to a second clock signal line that provides a second clock signal, a source electrode electrically connected to the turn-on signal line, and a drain electrode electrically connected to a source electrode of the fifth transistor,
        the fifth transistor includes a gate electrode electrically connected to the third node, a drain electrode electrically connected to the second node, and the source electrode electrically connected to the drain electrode of the fourth transistor,
        the first capacitor includes a first terminal electrically connected to the turn-on signal line and a second terminal electrically connected to the third node, and
        the second control unit is electrically connected to a first signal line that provides a first signal, the first node and the second node, configured for controlling whether the first signal is outputted to the second node; and
    an output circuit, electrically connected to the first node, the second node, the first signal line, a second signal line that provides a second signal, and a driving signal output line that outputs a driving signal, configured for responding to signals at the first node and the second node, selecting one of the first signal and the second signal as the driving signal, and providing the driving signal to the driving signal output line.

2. The shift register according to claim 1, the input circuit comprising a first transistor, wherein the first transistor includes a gate electrode electrically connected to the first clock signal line, a drain electrode electrically connected to the first node, and a source electrode electrically connected to the triggering signal line.

3. The shift register according to claim 1, wherein the second control unit comprises a sixth transistor, wherein the sixth transistor includes a gate electrode electrically connected to the first node, a source electrode electrically connected to the first signal line, and a drain electrode electrically connected to the second node.

4. The shift register according to claim 1, the output circuit comprising a first output unit and a second output unit, wherein:
    the first output unit is electrically connected to the first signal line, the second node, and the driving signal output line, configured for controlling the first signal to the driving signal output line based on a voltage of the second node; and
    the second output unit is electrically connected to the second signal line, the first node, and the driving signal output line, configured for controlling the second signal to the driving signal output line based on a voltage of the first node.

5. The shift register according to claim 4, the first output unit comprising a seventh transistor and a second capacitor, wherein:
    the seventh transistor includes a gate electrode electrically connected to the second node, a drain electrode electrically connected to the driving signal output line, and a source electrode electrically connected to the first signal line; and
    the second capacitor includes a first terminal electrically connected to the first signal line and a second terminal electrically connected to the second node.

6. The shift register according to claim 4, the second output unit comprising an eighth transistor and a third capacitor, wherein:
    the eighth transistor includes a gate electrode electrically connected to the first node, a drain electrode electrically connected to the driving signal output line, and a source electrode electrically connected to the second signal line; and the third capacitor includes a first terminal electrically connected to the driving signal output line and a second terminal electrically connected to the first node.

7. The shift register according to claim 1, further comprising a voltage-rectifying circuit, wherein the voltage-rectifying circuit is electrically connected to the first node, the second node, a third clock signal line that provides a third clock signal, and the first signal line, and configured to respond to the signal at the second node and the third clock signal, and control the first signal to be transmitted to the first node.

8. The shift register according to claim 6, the voltage-rectifying circuit comprising a ninth transistor and a tenth transistor, wherein:

the ninth transistor includes a gate electrode electrically connected to the second node, a source electrode electrically connected to the first signal line, and a drain electrode electrically connected to a source electrode of the tenth transistor; and the tenth transistor includes a gate electrode electrically connected to the third clock signal line, a drain electrode electrically connected to the first node, and the source electrode electrically connected to the drain electrode of the ninth transistor.

9. A gate driving circuit, comprising one or more cascading shift registers according to claim 1.

10. A method for driving the shift register according to claim 1, the method comprising:

controlling the input circuit to output the triggering signal to the first node;

controlling the input circuit to output no signal to maintain the first node at a first voltage level, and controlling the control circuit to output the turn-on signal to the second node to maintain the second node at a second voltage level, so that the output circuit, in response to the turn-on signal, outputs the first signal to the driving signal output line, the first signal having a same pulse width as the triggering signal; and controlling the input circuit to output the triggering signal to the first node, wherein the control circuit, in response to the triggering signal, provides the first signal to the second node, and the output circuit, in response to the triggering signal, provides the second signal to the driving signal output line.

11. The method according to claim 10, wherein:

controlling the input circuit to output the triggering signal to the first node is implemented in a triggering phase;

controlling the input circuit to output no signal to maintain the first node at the first voltage level, and controlling the control circuit to output the turn-on signal to the second node to maintain the second node at the second voltage level are implemented in a shifting phase; and controlling the input circuit to output the triggering signal to the first node is implemented in an ending phase.

12. A shift register, comprising:

an input circuit, electrically connected to a triggering signal line that provides a triggering signal, a first clock signal line that provides a first clock signal, and a first node, configured for controlling whether the triggering signal is outputted to the first node based on the first clock signal;

a control circuit, electrically connected to the first node, a second node, the first clock signal line, a second clock signal line that provides a second clock signal, and a turn-on signal line that provides a turn-on signal, configured for controlling whether the turn-on signal is outputted to the second node;

an output circuit, electrically connected to the first node, the second node, a first signal line that provides a first signal, a second signal line that provides a second signal, and a driving signal output line that outputs a driving signal, configured for responding to signals at the first node and the second node, selecting one of the first signal and the second signal as the driving signal, and providing the driving signal to the driving signal output line; and a voltage-rectifying circuit, electrically connected to the first node, the second node, a third clock signal line that provides a third clock signal, and the first signal line, and configured to respond to the signal at the second node and the third clock signal, and control the first signal to be transmitted to the first node.

* * * * *